United States Patent [19]
Johannessen

[11] 4,274,134
[45] Jun. 16, 1981

[54] METHOD OF AND APPARATUS FOR HIGH VOLTAGE PULSE GENERATION

[75] Inventor: Paul R. Johannessen, Lexington, Mass.

[73] Assignee: Megapulse Incorporated, Bedford, Mass.

[21] Appl. No.: 28,117

[22] Filed: Apr. 9, 1979

[51] Int. Cl.³ .......................................... H02M 3/18
[52] U.S. Cl. ..................................... 363/59; 307/106; 328/61; 328/156
[58] Field of Search .................. 307/106, 108; 328/60, 328/61, 156, 157, 65, 117; 363/59, 60

[56] References Cited
U.S. PATENT DOCUMENTS

| | | | |
|---|---|---|---|
| 3,211,915 | 10/1965 | Poehlman et al. ............... | 307/106 X |
| 3,435,249 | 3/1969 | Farrell .............................. | 328/65 X |
| 3,611,210 | 10/1971 | Theodore ......................... | 307/106 X |
| 3,786,334 | 1/1974 | Johannessen .................... | 307/108 X |
| 4,160,214 | 7/1979 | Colin et al. ...................... | 328/65 |

Primary Examiner—William M. Shoop
Attorney, Agent, or Firm—Rines and Rines, Shapiro and Shapiro

[57] ABSTRACT

This disclosure is concerned with generating in a plurality of successive modules, simultaneously and repetitively, a plurality of similar, simultaneous, narrow high voltage pulses, and adding them together in a way that the failure of mis-timing of any module will not prevent the continued operation of the resultant pulse generation. The result is attained by appropriate interconnection of the modules, each of which embodies triggered charging and preferably magnetic pulse-compression and step-up operations.

18 Claims, 7 Drawing Figures

METHOD OF AND APPARATUS FOR HIGH VOLTAGE PULSE GENERATION

The present invention relates to methods of and apparatus for high-voltage pulse generation, being more particularly concerned with the generation of high-voltage, high-power short duration pulses in a plurality of interconnected modules adapted for continuation operation despite possible individual module failures.

In the past, high-voltage, high-power, short duration pulses have been generated by such circuits as Marx generators (more modern versions of which are described, for example, on pages 35-38 and elsewhere in Energy Storage, Compression and Switching, Edited by W. H. Bostick et al, Plenum Press, N. Y., 1976), insulated core transformers, or by the series interconnection of a large number of active elements such as vacuum tubes, thyratrons, thyristors, SCR's or transistors or the like, (as described, for example, on pages 144-147 of SCR Applications Handbook, Edited by Richard A. Hoft, International Rectifier Corp., 1974).

The Marx generators and similar charging-discharging circuits are, however, greatly limited in frequency of pulse repetition rate and number of shots (or pulses). The insulated core transformer technique is bulky and also greatly limited in producable pulse width and shape. The use of series interconnection of active elements, moreover, is expensive and unreliable, and subject to system failure induced by one or more element failures.

In accordance with the present invention, on the other hand, the high-voltage pulse generation is subject to none of these disadvantages. No series interconnections of active elements are required, and failure of one active element does not cause failure of other active or passive elements; a wide variety of output pulse widths and shapes can be readily obtained by the pulse forming networks of the invention; and high pulse repetition rates (1000 PPS or higher) can be readily obtained.

An object of the invention, accordingly, is to provide a new and improved method of and apparatus for such pulse generation, void of the above-mentioned and other limitations and restrictions of prior art approaches.

A further object is to provide novel pulse generation apparatus and techniques and novel sub-assemblies thereof of more general applicability, as well.

Other and further objects are explained hereinafter and are more particularly delineated in the appended claims.

From one of its broad aspects the invention, in summary, contemplates a method of repetitive high-voltage pulse generation, that comprises, substantially simultaneously repetitively charging a plurality of similar charge storage modules; substantially simultaneously transferring and forming the energy of the charge in each module into similar narrow high-voltage output pulses in each module; interconnecting the modules to add the high-voltage output pulses of all the modules to produce resultant high-voltage output pulses corresponding to the totality of the output pulses of the modules, and preventing the peak voltage developed within each module from exceeding the peak output voltage of the module independently of the position of the module in the plurality of modules, such that module failure results only in reduction in the resultant output pulse power and enables continual operation even in the presence of such failure. Preferred constructional and other details follow.

The invention will now be described with reference to the accompanying drawings, FIG. 1 of which is a combined block and schematic circuit diagram of a preferred embodiment employing the method of pulse generation of the invention, illustrated in connection with series connection of pulse generator modules;

Figure 1:
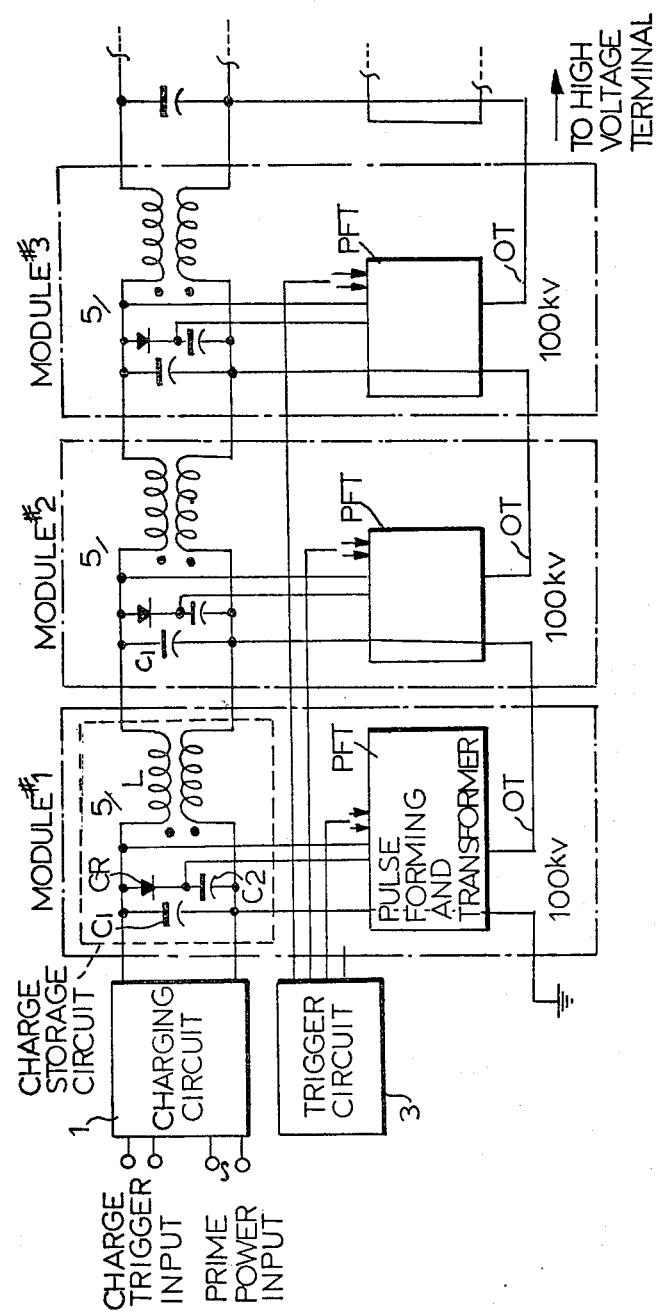

The high-voltage pulse generator of FIG. 1 comprises a charging circuit 1, a trigger circuit 3, and a number of pulse generator modules connected in series, labelled Module #1, Module #2, Module #3, etc. Each module consists of a charge storage circuit 5 and a pulse forming and transformer circuit PFT. These modules may, for example, be physically stacked, one on top of the other, thus forming a tall vertical structure. The output voltage of each module is indicated, for exemplary purposes, as 100 kV in FIG. 1, though larger voltages are readily feasible. In an actual application, of course, this voltage depends upon the peak output voltage required and the number of modules, with a number of practical design factors affecting the choice of module size and number, such as insulation material, output peak power, and pulse width. The optimum selection of these parameters depends upon the particular generator requirements.

The basic operation of the pulse generator is as follows. Initially, capacitors C1 and C2 in the charge storage circuit 5 of each module are charged up from the charging circuit 1 through the illustrated bifilar wound inductor L of each module; the inductor L being wound such that during the charging interval, only the leakage inductance affects the charging current. The energy on capacitor C1 provides the energy for the output power pulse. The energy on C2, on the other hand, stored through diode CR, provides a relatively small amount of power required for the control and rest (or bias) circuits in the pulse forming and transformer circuit PFT. When the charging of C1 and C2 have been completed, the trigger circuit 3 activates electronic switches in each PFT circuit, as later detailed in connection with FIGS. 4 and 5. This action transfers the energy on capacitors C1 and C2 to the PFT circuit, which, in turn, generates a high-voltage output pulse at high-voltage output terminal OT. The triggering of the electronic switches in the PFT circuit is timed such that the output pulses of all modules occur at the same instant of time, producing a resultant high voltage output pulse of amplitude equal to the sum or totality of the individual PFT circuit outputs at OT.

The voltage to which capacitors C1 are charged initially may be relatively low, typically of the order of 1000 volts. By means of the later-described transformer action in the PFT circuit, this voltage is stepped up to a considerably higher value, such as the illustrative, for example, 100 kV at the output; and this output voltage is impressed across the bifilar inductor L because the high voltage output terminal OT is connected directly to the low side of capacitor C1 on the following module. The appearance of the high output voltage across L generates a current in the inductor windings, thereby causing some of the output pulse energy to be transferred back into the charge storage circuit 5. Because the inductor L is bifilar wound, as before discussed, it presents a low impedance (leakage inductance) to the charging current of capacitors C1 and C2, and a high impedance (self-inductance) to the output pulse, such that the energy transferred back to the charge storage circuit 5 (capacitors C1 and C2) of each module is, however, only a small fraction of the total pulse energy.

Since, a stated, the high output voltage is impressed across the inductor L, all the terminals that interconnect successive modules are at the same potential as the high voltage output terminal of the preceding module, thereby causing each successive module to rise in potential by an increment of 100 kV, or whatever the peak output voltage of a module is designed to be. In this manner, the peak voltage within a module never exceeds the peak output voltage of the module, and this is independent of the module position in the stack. Any number of modules can accordingly be connected together in accordance with the invention to produce any desired output voltage without increasing the voltage stress level of each module.

Figure 2:
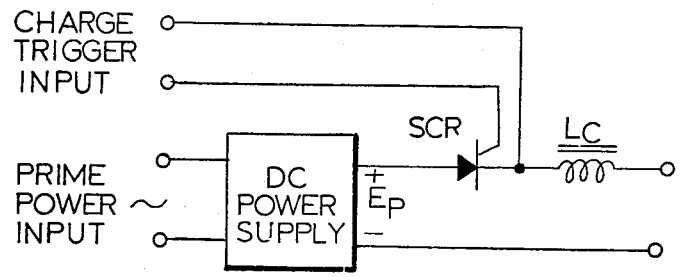
FIG. 2 is a fragmentary circuit diagram of a suitable charging circuit for use in the systems of FIG. 1, FIGS. 3(a) and (b) are respectively an equivalent circuit of FIG. 2 during the charging interval, and a graph of charging current and voltage waveforms thereof.
Figure 3A:
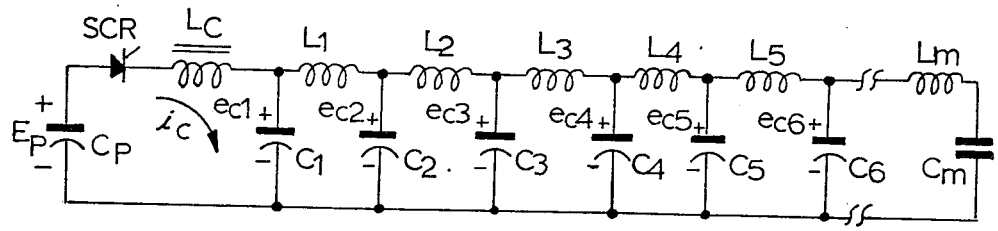
Figure 3B:
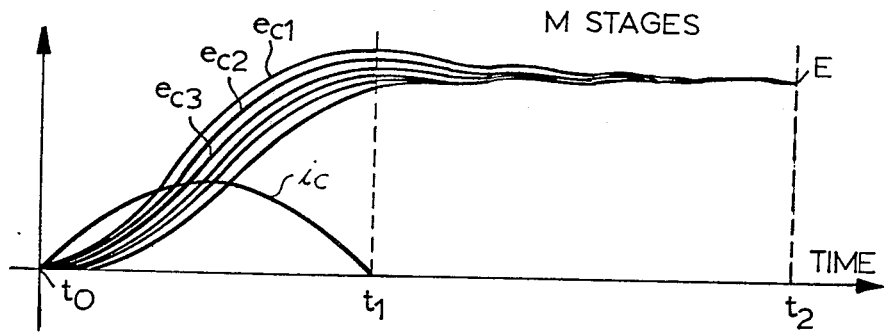

A schematic circuit diagram of a useful charging circuit 1 is shown in FIG. 2, comprising a d-c power supply, so-labelled, a silicon controlled rectifier (SCR), and a charging inductor ($L_c$). The charging of the modules is illustrated in an equivalent circuit during the charging interval (FIG. 3(a)), and the voltage and current waveforms in FIG. 3(b). Referring to the equivalent circuit of FIG. 3(a), the charging circuit is represented by the d-c power supply capacitor $C_p$, the SCR trigger switch, and the charging inductor $L_c$, with each charging module represented by a similar shunt capacitor and a similar series inductor; that is, module #1 is represented by $C_1$ and $L_1$, module #2 by $C_2$ and $L_2$, . . . $C_m$-$L_m$, etc., forming the ladder or stack structure of FIG. 3(a). The inductances $L_1$ through $L_m$ are physically the leakage inductances of the bifilar wound inductors of the charge storage circuits 5 of the modules that couple successive module charge storage circuits 5, and by design, the inductance values of the leakage inductances are made much smaller than $L_c$. Furthermore, the sum of the capacitances $C_1$ through $C_m$ is adjusted to be much smaller than the capacitance $C_p$. As a result, the voltage waveforms across capacitors $C_1$, $C_2$, etc. during the charging interval are of the form shown in FIG. 3(b). Because of the series inductors, moreover, the capacitor voltage waveforms are slightly delayed from each other, and this delay increases with the order of the module section, such that the last capacitor in the ladder structure, $C_m$, has the smallest voltage at time $t_1$; i.e. the time representing the end of the active charging interval in which current flows from the charging circuit to the modules. Thus, at time $t_1$ when the SCR turns off, the capacitors in the ladder structure are charged to slightly different voltage levels, with capacitor $C_1$ having the largest value and capacitor $C_m$, the smallest. During the remaining part of the charging interval, $t_1$ to $t_2$ in FIG. 3, these voltages equalize to the final value E.

Figure 4:
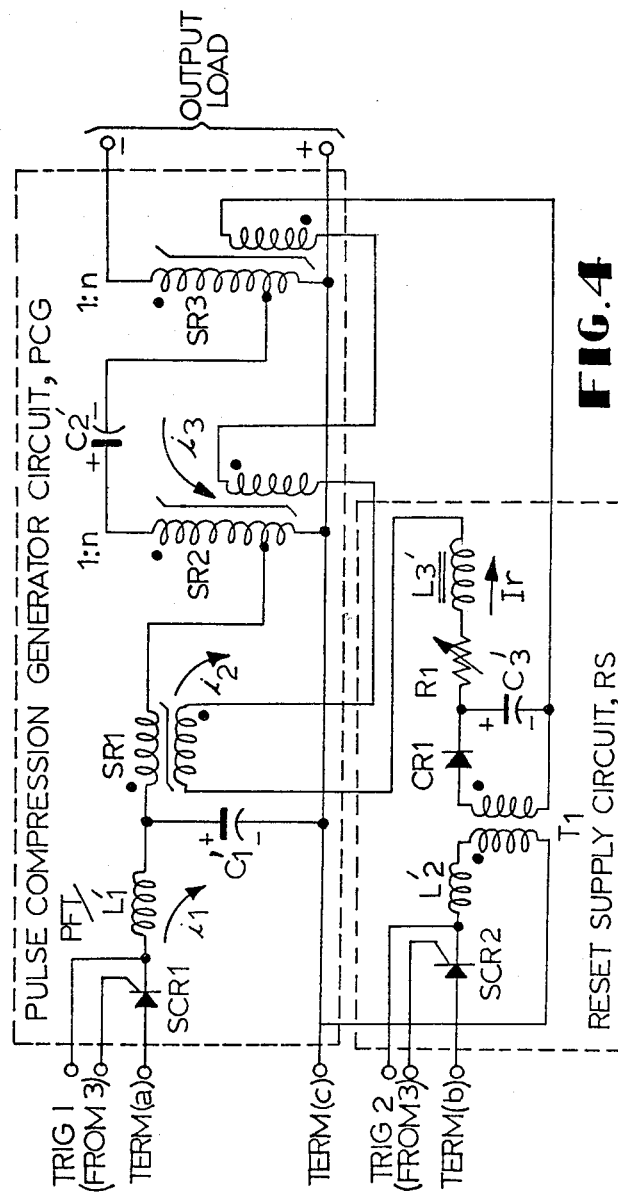
FIG. 4 is a circuit diagram of a preferred pulse forming and transformer (PFT) circuit using pulse compression.

A schematic circuit diagram of a suitable pulse forming and transformer circuit (PFT) is shown in FIG. 4. This circuit uses a combination of SCR's and magnetic pulse compression circuits to generate very narrow high power pulses. The circuit consists of two parts; the pulse compression generator circuit PCG, and the reset supply circuit RS. The PCG circuit comprises SCR1, series inductance L1', shunt capacitor C1', a first saturable reactor SR1, a second saturable reactor SR2, a third saturable reactor SR3, and capacitor C2' interconnecting the last two-named saturable reactors.

The RS circuit illustrated in FIG. 4, comprises SCR2, triggered by signal "Trig.2", series inductor L2', shunt transformer T1, series diode CR1, shunt capacitor C3' series variable resistor R1, and output inductor L3'.

The operation of the PCG circuit is as follows. A trigger signal ("Trig. 1") applied from the trigger circuit 3 (FIG. 1) to the gate of SCR1 causes SCR1 to conduct and transfers or discharges the energy on the capacitors C1 of the charge storage circuit 5 of FIGS. 1, 2 and 3, to capacitor C1' through inductor L1'. This energy transfer takes place in the time interval $t_0$ to $t_1$ of FIG. 5. Since the saturable reactor SR1 is biased into negative saturation by the reset current $I_r$ from the reset supply circuit RS, FIG. 4, prior to energy transfer, the voltage developed across C1' drives the first saturable reactor SR1 from negative to positive saturation. The saturable reactor SR1 is designed such that at time $t_1$ (the completion time of energy transfer), it reaches positive saturation, and the impedance of SR1 then switches from a very high to a low value. Since the saturable reactor SR2 is biased into negative saturation by the reset current $I_r$, and the saturable reactor SR3 is biased into positive saturation by the same reset current, SR2 acts like an autotransformer and SR3 as a short circuit or very low impedance for the current $i_2$, FIG. 5, that flows through SR1. Thus, when the saturable reactor SR1 saturates, the energy on capacitor C1' is transferred to capacitor C2' in the time interval $t_1$ to $t_2$ of FIG. 5. The saturable reactor SR2 is driven from negative to positive saturation by the voltage $e_{c2}'$ across capacitor C2'. Reactor SR2 is designed such that at time $t_2$, it reaches positive saturation and it becomes a low impedance for current flowing in the positive direction as defined by the current arrow $i_3$. The voltage on capacitor C2' is therefore impressed across the saturable reactor SR3; and since this reactor is biased into positive saturation by the reset current $I_r$, the current $i_3$ resulting from the impressed $e_{c2}'$ voltage drives SR3 into the unsaturated region. Saturable reactor SR3 then starts to act like an autotransformer and the energy on C2' is discharged into the load during the time interval $t_2$ to $t_3$.

Figure 5:
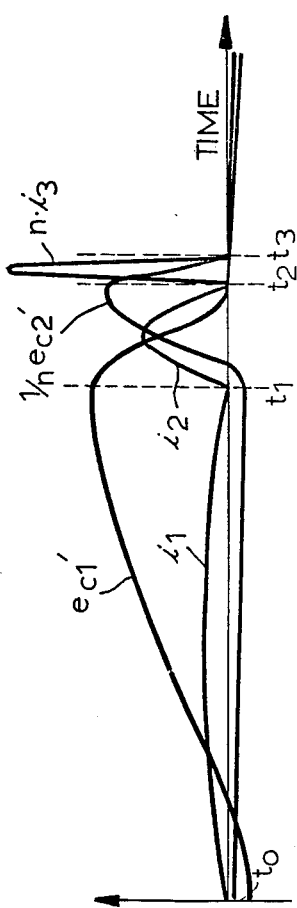
FIG. 5 is a graph showing voltage and current waveforms of the PFT circuit of FIG. 4.

As seen from the waveform graph FIG. 5, the operation of the circuit is characterized by three energy transfer time intervals:

$t_0 \rightarrow t_1$, transfer of energy from charging circuit 1 to C1' of FIG. 4;

$t_1 \rightarrow t_2$, transfer of energy from C1' to C2'; and $t_2 \rightarrow t_3$, transfer of energy from C2' to load.

It should be further observed from FIG. 5 that each of these time intervals gets progressively shorter, typical values of the same, for example, being:

$t_0 \rightarrow t_1$, 25 $\mu$sec;

$t_1 \to t_2$, 5 μsec; and
$t_2 \to t_3$, 1 μsec.

While this magnetic pulse compression of energy discharge time of the circuit of FIG. 4 occurs in two stages, any number of magnetic pulse compression stages can be implemented by the further cascading of series-connected capacitors and shunt-connected saturable reactors, enabling very narrow high peak power pulses to be generated, as desired, from relatively wide low peak power pulses.

In the embodiment of FIG. 4, both SR2 and SR3 are connected as effective step-up autotransformers, such that the low voltage pulse on capacitor C1' is converted into a narrow high voltage pulse at the output. As an illustration, a voltage of 1 Kv on C1' is converted into a 100 Kv output voltage pulse if a step-up of 10 is used in each saturable reactor (assuming zero losses). In view of practical circuit losses, however, a value slightly less than 100 Kv will be obtained in actual operation. As further indicated in FIG. 5, moreover, the initial voltages $e_{c1'}$ and $e_{c2'}$ on C1' and C2' are slightly negative, resulting from the reset current $I_r$. Through transformer action in SR1, SR2, and SR3, the reset current charges up these capacitors in the inter-pulse interval to a slightly negative value.

Figure 6:
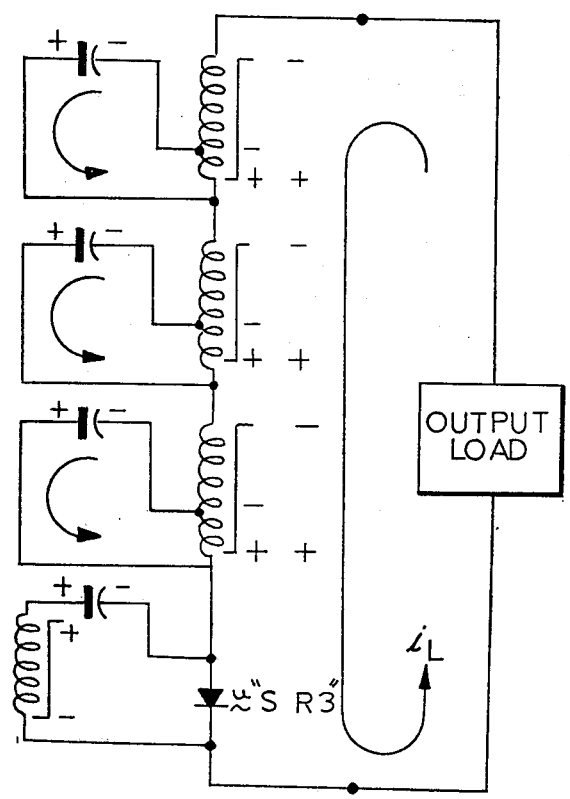
FIG. 6 is an equivalent circuit thereof when one module fires late.

The timing of the trigger pulses for each PFT module is adjusted, in accordance with the invention, such that the saturable reactor SR2 of each PFT module saturates at the same instant of time. Since the saturable reactor windings of SR3 are connected in series, the pulse generator output voltage is the sum of the PFT module output voltages. In case the output pulse of one of the modules does not, however, coincide in time with the output pulses of the other modules, the saturable reactor SR3 of the non-conforming module will act like a forward-conducting diode for the current generated by the other modules. This important property is illustrated in the equivalent circuit of FIG. 6. Thus, by the technique herein employed, the voltage across the output of a module can never exceed its own peak output voltage, providing novel features of fail-safe operation under all trigger conditions, and without the prior art use of series interconnection of high-voltage diodes or other protective devices. The invention additionally makes possible timing trigger adjustment at full power operation.

Figure 7A:
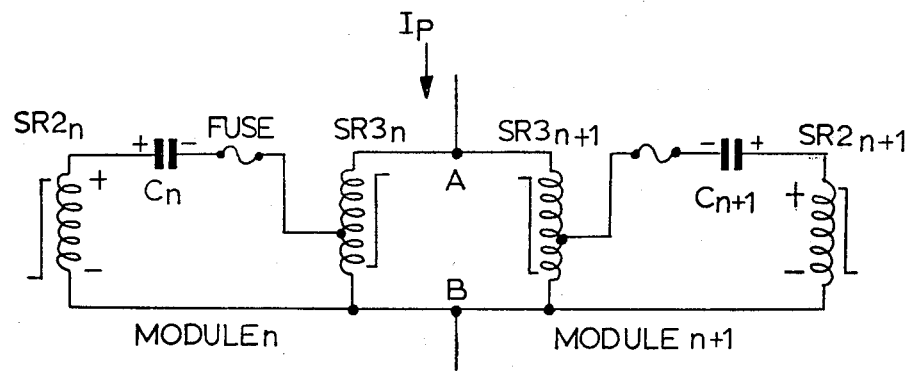
FIG. 7(a) is a circuit showing parallel interconnection of pulse generation modules.
Figure 7B:
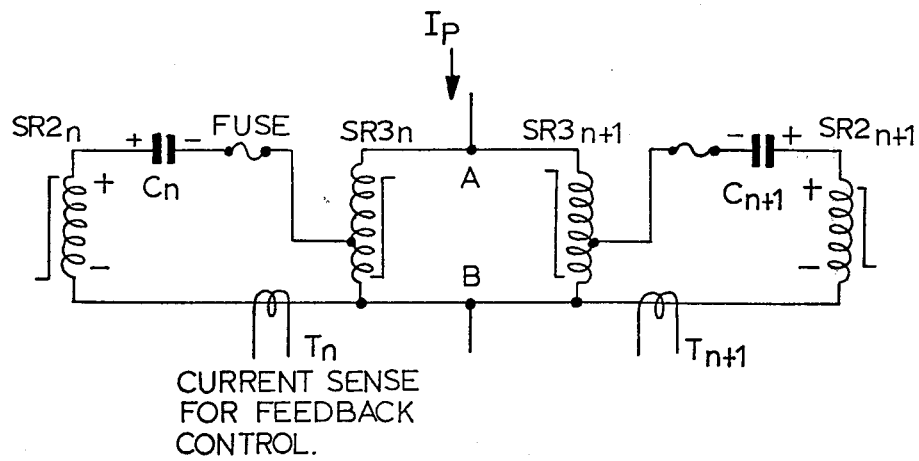
FIG. 7(b) is a circuit showing use of current sensing windings with the pulse generation modules for feedback control.

While the pulse generator embodiment of FIG. 1 is shown as a series interconnection of modules, with the number of modules being determined by the ratio of the total output power required to the output power of each module, for very large pulse generators, both parallel and series interconnections of modules may be necessary and/or desirable. In FIGS. 7 (a) and (b), accordingly, the modules n and n+1, with respective saturable reactors $SR2_n$—$SR3_n$ and $SR2_{n+1}$—$SR3_{n+1}$, are shown parallel-connected at A and B, receiving curent $I_p$. Again, however, in accordance with the method underlying the invention, there are no problems resulting from non-coincidence of output current pulses of modules so connected in parallel. All parallel-connected modules can also be adjusted in time while operating at full power, which has the desirable features of allowing automatic timing adjustment by means of digital feedback loops of all modules. As more particularly shown in FIG. 7(b), for example, the output current pulse of each module may be sensed by means of a current transformer; $T_n$ for module n, and $T_{n+1}$ for module n+1, with the signals from the transformers being used to determine the time of occurence of the output current pulse, as is well-known.

In certain applications (laser fusion, for example), pulse energy levels of the order of $10^5$ joules may be required. With existing components, a reasonable energy output per module is 10 joules, requiring 10,000 modules. With such a large number of modules, the mean time between failure would be in the order of a few hours, such that, to obtain continual operation, module failure of any kind should not cause system failure. The only effect of a failed module in accordance with the invention, fortuitously, is a reduction in output pulse power, this reduction being equal to the output power of the failed module. Only failures of the type that cause excessive current drain into the failed module affects overall system operation, and by means of fuses or circuit breakers sensitive to excessive current (FIG. 7), the failed module can readily be disconnected from the pulse generator.

Further modifications will also occur to those skilled in this art, and such are considered to fall within the spirit and scope of the invention as defined in the appended claims.

What is claimed is:

1. High voltage generator apparatus having, in combination, repetitively triggered charging circuit means; a plurality of successively connected similar pulse-generating modules connected with the charging circuit means and each comprising charge storage circuit means and pulse forming and transformer circuit means; trigger circuit means operable upon each charging of said charge storage circuit means of each module for thereupon triggering the transfer of the energy of such charging to the corresponding module pulse forming and transformer circuit means in order to form therein a stepped-up high-voltage output pulse, with the said high-voltage output pulse of each module thereby occurring at substantially the same instant of time, producing a resultant high-voltage output pulse corresponding to the totality of the output pulses of the pulse forming and transformer circuit means of the plurality of modules; and means cooperative with the connections between the successive modules for preventing the peak voltage within each module from exceeding the peak output voltage of the module independent of the position of the module in the plurality of modules, such that module failure results only in a reduction in the resultant output pulse power and enables continual operation even in the presence of such failure.

2. Apparatus as claimed in claim 1 and in which said charge storage circuit means of each module comprises capacitor means connected to be charged through inductor means presenting predetermined inductance effects during said charging, the said capacitor means providing the energy for generating the high-voltage pulse in the corresponding pulse forming and transformer circuit means, and control and reset energy therefor.

3. Apparatus as claimed in claim 2 and in which each said pulse forming and transformer circuit means comprises a triggered magnetic pulse compression and step-up means for generating relatively narrow high peak power pulses from the energy transferred thereto from the capacitor means of the corresponding module charge storage circuit means.

4. Apparatus as claimed in claim 3 and in which said magnetic pulse compression means comprises a plurality of stages of saturable reactor means controlled by said trigger circuit means to transfer energy from stage to stage in successively shorter time intervals and with successive step-up of the pulse voltage generated in each stage.

5. Apparatus as claimed in claim 2 and in which means is provided for controlling the said transfer of energy such that the charging of the capacitor means of the charge storage circuit means of the successive modules in the plurality of modules is successively slightly delayed and slightly less in voltage than in the preceding module, with the voltage subsequently substantially equalizing thereafter.

6. Apparatus as claimed in claim 2 and in which said modules are successively series-connected in the said plurality of modules.

7. Apparatus as claimed in claim 6 and in which the charging circuit means comprises triggered power supply capacitor means and charging inductance, with the said predetermined inductance presented during said charging by the said inductor means of the charge storage circuit means of the modules being adjusted to be of value smaller than that of said charging inductance, and the sum of the capacitance of said capacitor means of each module charge storage circuit means being adjusted to be substantially smaller than the said power supply capacitor means.

8. Apparatus as claimed in claim 2 and in which modules of said plurality of modules are connected in parallel.

9. Apparatus as claimed in claim 8 and in which said pulse forming and transformer circuit means of parallel-connected modules comprise triggered magnetic pulse-compression stages embodying saturable reactors, with the parallel connection occuring between saturable reactor stages of successive moules.

10. Apparatus as claimed in claim 1 and in which the charge storage circuit means of the successive modules each comprise capacitor means and inductor means across the latter of which the high-voltage output of a preceding module is impressed, with the terminals that interconnect successive modules being at the same potential as the high voltage output terminal of the preceding modules.

11. Apparatus as claimed in claim 10 and in which each of said inductor means comprise a bifilar wound inductance adjusted such that during the charging interval only the leakage inductance thereof affects the charging current.

12. Apparatus as claimed in claim 10 and in which the said inductor means of the charge storage circuit means of a module is connected to the said capacitor means of the charge storage circuit means of the next successive modules.

13. Apparatus as claimed in claim 4 and in which means is provided to cause saturable reactor means of a module, the output of which may not coincide in time with the output pulses of the other modules of the plurality of modules, to act in the nature of a forwardconducting means for the current generated by the other modules.

14. A method of repetitive high-voltage pulse generation, that comprises, substantially simultaneously repetitively charging a plurality of similar charge storage modules; substantially simultaneously transferring and forming the energy of the charge in each module into similar narrow high-voltage output pulses in each module; interconnecting the modules to add the high-voltage output pulses of all the modules to produce resultant high-voltage output pulses corresponding to the totality of the output pulses of the modules; and preventing the peak voltage developed within each module from exceeding the peak output voltage of the module independent of the position of the module in the plurality of modules, such that module failure results only in reduction in the resultant output pulse power and enables continual operation even in the presence of such failure.

15. A method as claimed in claim 14 and in which said transferring and forming steps are effected by successive pulse compressing of the said energy of the charge in each module and successive stepping-uo of the resulting pulse voltage to form the similar narrow high-voltage output pulse each time the charge storage modules are charged.

16. A method as claimed in claim 15 and in which said pulse comprising and stepping-up are effected through triggered magnetic saturable reactor energization.

17. A method as claimed in claim 15 and in which said transferring and forming steps are effected in response to triggering the discharge of the said energy of the charge in each module, and timing adjustment of such triggering is effected at full power operation.

18. A method as claimed in claim 13 and in which the successive charge storage modules are inductively connected and the interconnecting of successive modules is effected at the same potential as the high voltage output terminal of the preceding module.

* * * * *